(12) United States Patent
Lee (10) Patent No.: US 11,569,360 B2
(45) Date of Patent: Jan. 31, 2023

(54) POWER SEMICONDUCTOR DEVICE AND POWER SEMICONDUCTOR CHIP

(71) Applicant: HYUNDAI MOBIS CO., LTD., Seoul (KR)

(72) Inventor: Ju Hwan Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/319,236

(22) Filed: May 13, 2021

(65) Prior Publication Data
US 2021/0359093 A1 Nov. 18, 2021

(30) Foreign Application Priority Data
May 15, 2020 (KR) .................. 10-2020-0058261

(51) Int. Cl.
*H01L 29/423* (2006.01)
*H01L 29/06* (2006.01)
*H01L 29/739* (2006.01)

(52) U.S. Cl.
CPC ...... *H01L 29/4236* (2013.01); *H01L 29/0696* (2013.01); *H01L 29/7397* (2013.01)

(58) Field of Classification Search
CPC ............. H01L 29/4236; H01L 29/0696; H01L 29/7397

(Continued)

(56) References Cited

U.S. PATENT DOCUMENTS 6,180,966 B1* 1/2001 Kohno ............... H01L 29/7397
257/378
2004/0256668 A1* 12/2004 Kawaguchi ......... H01L 29/7813
257/E29.136

(Continued)

FOREIGN PATENT DOCUMENTS

DE 10 2015 108 410 A1 12/2015
DE 10 2019 208 844 A1 12/2019

(Continued)

OTHER PUBLICATIONS

German Office Action dated Mar. 17, 2022, in counterpart German Patent Application No. 10 2021 112 606.1 (9 pages in English and 9 pages in German).

(Continued)

*Primary Examiner* — Igwe U Anya
(74) *Attorney, Agent, or Firm* — NSIP Law (57) ABSTRACT

A power semiconductor device includes a semiconductor layer, a ladder-shaped trench recessed a specific depth from a surface of the semiconductor layer into the semiconductor layer and including a pair of lines having a first depth and a plurality of connectors connected between the pair of lines and having a second depth shallower than the first depth, a well region defined in the semiconductor layer between the pair of lines and between the plurality of connectors of the trench, a floating region defined in the semiconductor layer outside the pair of lines of the trench, a gate insulating layer disposed on an inner wall of the trench, and a gate electrode layer disposed on the gate insulating layer to fill the trench and including a first portion in which the pair of lines is filled and a second portion in which the plurality of connectors is filled. A depth of the second portion of the gate electrode layer is shallower than a depth of the first portion of the gate electrode layer.

7 Claims, 6 Drawing Sheets

(58) Field of Classification Search
USPC .......................................................... 257/330
See application file for complete search history.

(56) References Cited

U.S. PATENT DOCUMENTS

| | | | | |
|---|---|---|---|---|
| 2014/0084332 A1* | 3/2014 | Lee | .................... | H01L 29/7397 |
| | | | | 257/139 |
| 2017/0256607 A1* | 9/2017 | Kim | .................... | H01L 29/7397 |
| 2018/0097094 A1* | 4/2018 | Naito | .................. | H01L 29/4236 |
| 2018/0224495 A1* | 8/2018 | Takeuchi | .......... | H01L 29/66333 |

FOREIGN PATENT DOCUMENTS

| | | |
|---|---|---|
| JP | 6-120495 A | 4/1994 |
| JP | 2002-83963 A | 3/2002 |
| JP | 2005-11965 A | 1/2005 |
| JP | 2014-64005 A | 4/2014 |
| JP | 2018-67624 A | 4/2018 |
| KR | 10-2008-0083184 A | 9/2008 |
| KR | 10-2014-0038750 A | 3/2014 |
| KR | 10-2014-0057630 A | 5/2014 |

OTHER PUBLICATIONS

Japanese Office action dated May 31, 2022, in counterpart Japanese Patent Application No. 2021-082747 (4 pages in Japanese).
Korean Office Action dated May 9, 2021 in counterpart Korean Patent Application No. 10-2020-0058261 (6 pages in Korean).

* cited by examiner

POWER SEMICONDUCTOR DEVICE AND POWER SEMICONDUCTOR CHIP

CROSS-REFERENCE TO RELATED APPLICATION

This application claims the benefit of priority to Korean Patent Application No. 10-2020-0058261, filed in the Korean Intellectual Property Office on May 15, 2020, the entire contents of which are incorporated herein by reference.

TECHNICAL FIELD

The present disclosure relates to a semiconductor device, and more particularly, to a power semiconductor device and a power semiconductor chip for switching power transmission.

BACKGROUND ART

A power semiconductor device is a semiconductor device operating in a high voltage and high current environment. The power semiconductor device is used in fields requiring high power switching, for example, an inverter device. For example, the power semiconductor device may include an insulated gate bipolar transistor (IGBT), a power MOSFET, and the like. The power semiconductor device requires basically breakdown characteristics to high voltage, and recently, additionally, a high-speed switching operation.

The semiconductor device operates when electrons injected from a channel and holes injected from a collector flow. However, in a trench gate type power semiconductor device, when holes are excessively accumulated in the trench gate, a negative gate charging (NGC) phenomenon occurs and a displacement current is generated in a gate direction. The trench gate type power semiconductor device has a large gate-to-collector capacitance (Cgc), which is greatly affected by the negative gate charging (NGC), thereby causing an issue in switching stability.

PRIOR ART LITERATURE (Patent Document 1) Republic of Korea Publication No. 20140057630 (published on May 13, 2014)

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power semiconductor device includes a semiconductor layer, a ladder-shaped trench recessed a specific depth from a surface of the semiconductor layer into the semiconductor layer and including a pair of lines having a first depth and a plurality of connectors connected between the pair of lines and having a second depth shallower than the first depth, a well region defined in the semiconductor layer between the pair of lines and between the plurality of connectors of the trench, a floating region defined in the semiconductor layer outside the pair of lines of the trench, a gate insulating layer disposed on an inner wall of the trench, and a gate electrode layer disposed on the gate insulating layer to fill the trench and including a first portion in which the pair of lines is filled and a second portion in which the plurality of connectors is filled. A depth of the second portion of the gate electrode layer is shallower than a depth of the first portion of the gate electrode layer.

A width of each of the connectors may be greater than a width of each of the pair of lines, and a width of the second portion of the gate electrode layer may be greater than a width of the first portion of the gate electrode layer.

The floating region may extend below the pair of lines to surround a bottom surface of the first portion of the gate electrode layer, and a bottom surface of the second portion of the gate electrode layer may be exposed with respect to the floating region.

The depth of the second portion of the gate electrode layer may be deeper than a depth of the well region.

The power semiconductor device may include source regions or emitter regions which are adjacent to the second portion of the gate electrode layer in the well region and are spaced apart from each other in an extension direction of the first portion of the gate electrode layer.

The power semiconductor device may include a drift region defined in the semiconductor layer under the well region.

The drift region and the source regions or the emitter regions may be doped with an impurity of a first conductivity type, and the well region and the floating region may be doped with an impurity of a second conductivity type opposite to the first conductivity type.

In another general aspect, a power semiconductor chip includes: a semiconductor layer including a main cell area and a sensor area; a power semiconductor transistor disposed in the main cell area and including the power semiconductor device; a current sensor transistor disposed in the sensor area to monitor a current of the power semiconductor transistor; an emitter terminal connected to an emitter electrode of the power semiconductor transistor; a current sensor terminal connected to an emitter electrode of the current sensor transistor; and a gate terminal connected to a gate electrode of the power semiconductor transistor and a gate electrode of the current sensor transistor.

Other features and aspects will be apparent from the following detailed description, the drawings, and the claims.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Hereinafter, an embodiment of the present disclosure will be described in detail with reference to the accompanying drawings. However, the present disclosure is not limited to the embodiments disclosed below, but may be implemented in various different forms. The following examples are provided to complete disclosure of the present disclosure, and to fully inform those of ordinary skill in the scope of the present disclosure. In addition, for convenience of description, at least some of the constituent elements may be exaggerated or reduced in size in the drawings. In the drawings, the same reference numerals refer to the same elements.

Unless otherwise defined, all terms used herein have the same meaning as commonly understood by one of ordinary skill in the art. In the drawings, the sizes of layers and regions are exaggerated for the sake of explanation, and thus are provided to explain the general structures of the present disclosure.

The same reference numerals denote the same elements. When referring to a configuration such as a layer, region, or substrate as being on another configuration, it will be understood that it is in the immediately upper trench of the other configuration or that there may also be other intervening configurations in between. On the other hand, when it is referred to as being "directly on" of another configuration, it is understood that there are no intervening configurations.

Figure 1:
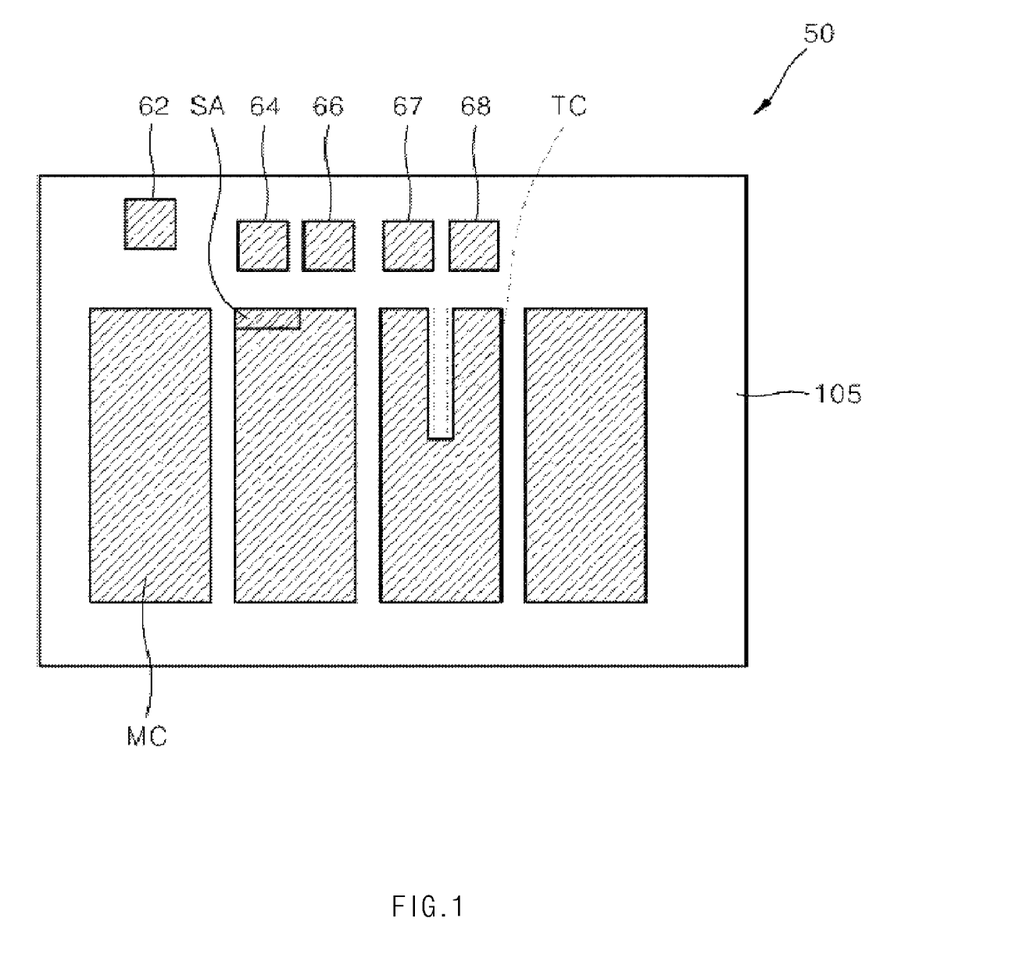
FIG. 1 is a schematic plan view showing a power semiconductor chip according to an embodiment of the present disclosure.
Figure 2:
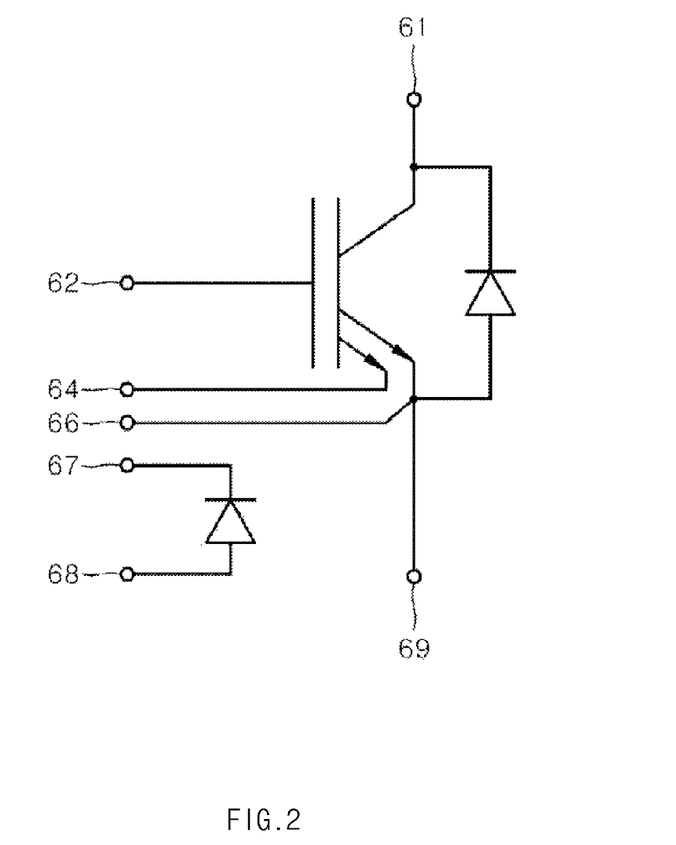
FIG. 2 is a circuit diagram showing a power semiconductor chip according to an embodiment of the present disclosure.
Figure 3:
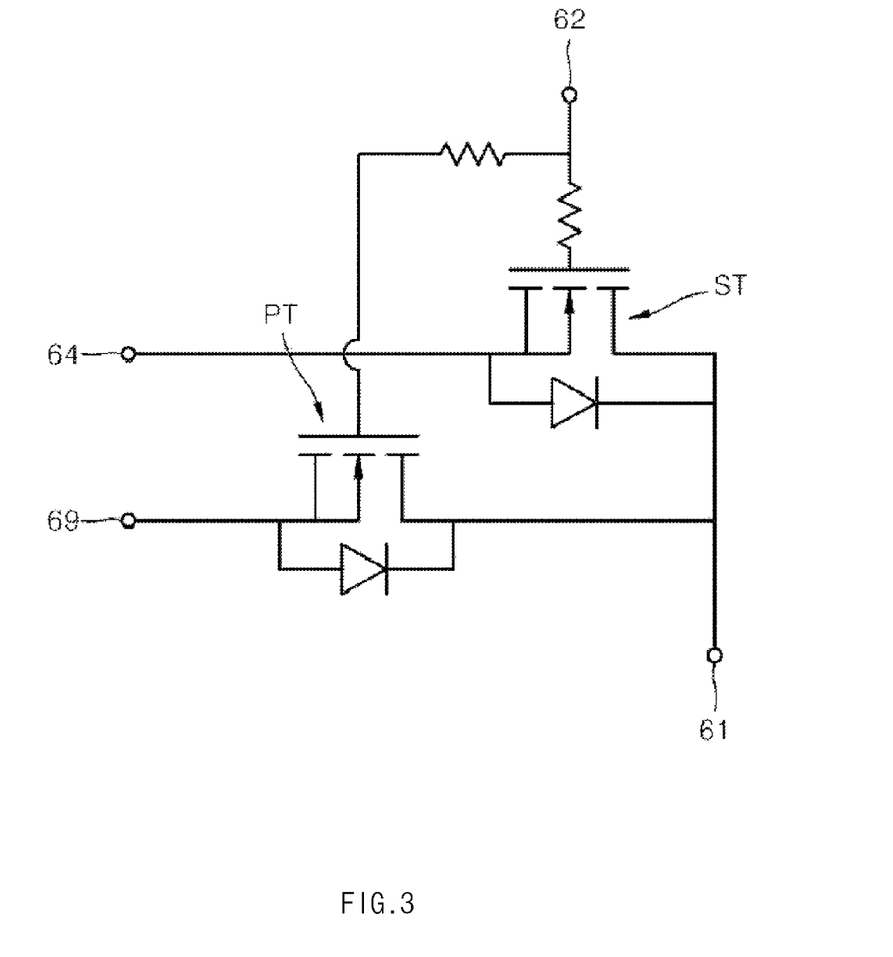
FIG. 3 is a circuit diagram showing a part of the power semiconductor chip of FIG. 2.

FIG. 1 is a schematic plan view showing a power semiconductor chip 50 according to an embodiment of the present disclosure, FIG. 2 is a circuit diagram showing the power semiconductor chip 50 according to an embodiment of the present disclosure, and FIG. 3 is a circuit diagram showing a part of the power semiconductor chip of FIG. 2.

Referring to FIG. 1, the power semiconductor chip 50 may be formed using a semiconductor layer 105 including a main cell area MC and a sensor area SA. The power semiconductor chip 50 may include a wafer die or packaging structure.

A plurality of power semiconductor transistors (PT of FIG. 3) may be formed in the main cell area MC. A plurality of current sensor transistors (ST of FIG. 3) may be formed in the sensor area SA to monitor currents of the power semiconductor transistors PT.

For example, the power semiconductor transistors PT and the current sensor transistors ST may include an insulated gate bipolar transistor (IGBT) or a power MOSFET structure. The IGBT may include a gate electrode, an emitter electrode, and a collector electrode. In FIGS. 2 to 3, a case in which the power semiconductor transistors PT and the current sensor transistors ST are IGBTs will be described as an example.

Referring to FIGS. 1 to 3, the power semiconductor chip 50 may include a plurality of terminals for connection with the outside.

For example, the power semiconductor chip 50 may include an emitter terminal 69 connected to an emitter electrode of the power semiconductor transistors PT, a Kelvin emitter terminal 66 connected to a Kelvin emitter electrode of the power semiconductor transistors PT, a current sensor terminal 64 connected to an emitter electrode of the current sensor transistors ST for monitoring current, a gate terminal 62 connected to gate electrodes of the power semiconductor transistors PT and gate electrodes of the current sensor transistors ST, temperature sensor terminals 67 and 68 connected to the temperature sensor TC for monitoring temperature, and/or a collector terminal 61 connected to collector electrodes of the power semiconductor transistors PT and collector electrodes of the current sensor transistors ST.

In FIG. 2, the collector terminal 61 may be formed on a rear surface of the semiconductor layer 105 of FIG. 1, and the emitter terminal 69 in FIG. 2 may be formed on the main cell area MC of FIG. 1.

The temperature sensor TC may include a junction diode connected to the temperature sensor terminals 67 and 68. The junction diode may include a junction structure between at least one n-type impurity region and at least one p-type impurity region, such as a P-N junction structure, a P-N-P junction structure, an N-P-N junction structure, and the like.

This structure exemplarily describes a structure in which the temperature sensor TC is embedded in the power semiconductor chip 50, but the temperature sensor TC may be omitted in a modified example of this embodiment.

The power semiconductor transistor PT is connected between the emitter terminal 69 and the collector terminal 61, and the current sensor transistor ST is partially connected in parallel with the power semiconductor transistor PT between the current sensor terminal 64 and the collector terminal 61. The gate electrode of the current sensor transistor ST and the gate electrode of the power semiconductor transistor PT are sharedly connected to the gate terminal 62 through a certain resistor.

The current sensor transistor ST may be formed in substantially the same structure as the power semiconductor transistor PT, but may be reduced to a specific ratio. Accordingly, an output current of the power semiconductor transistor PT may be indirectly monitored by monitoring an output current of the current sensor transistor ST.

Figure 4:
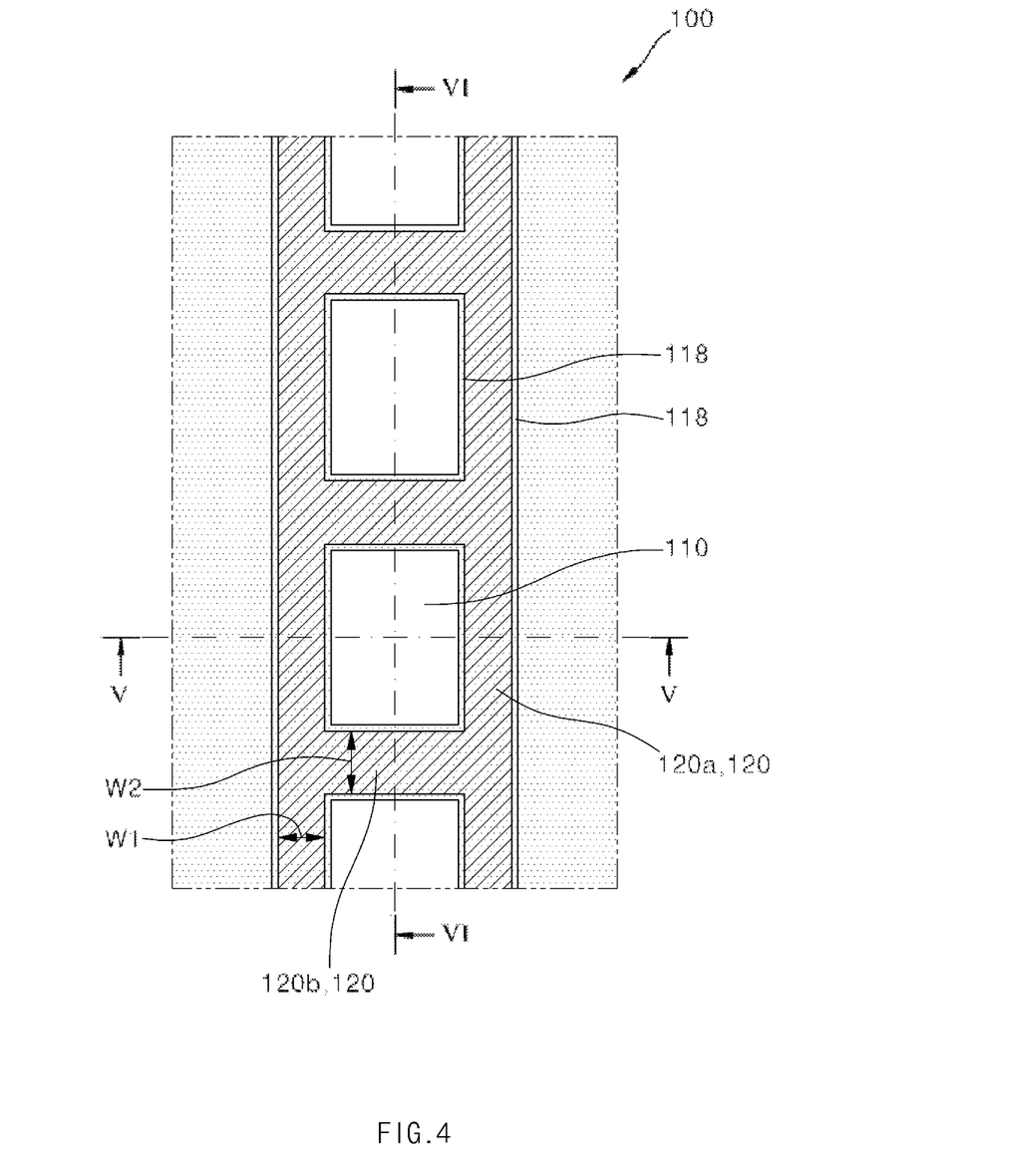
FIG. 4 is a plan view showing a power semiconductor device according to an embodiment of the present disclosure.
Figure 5:
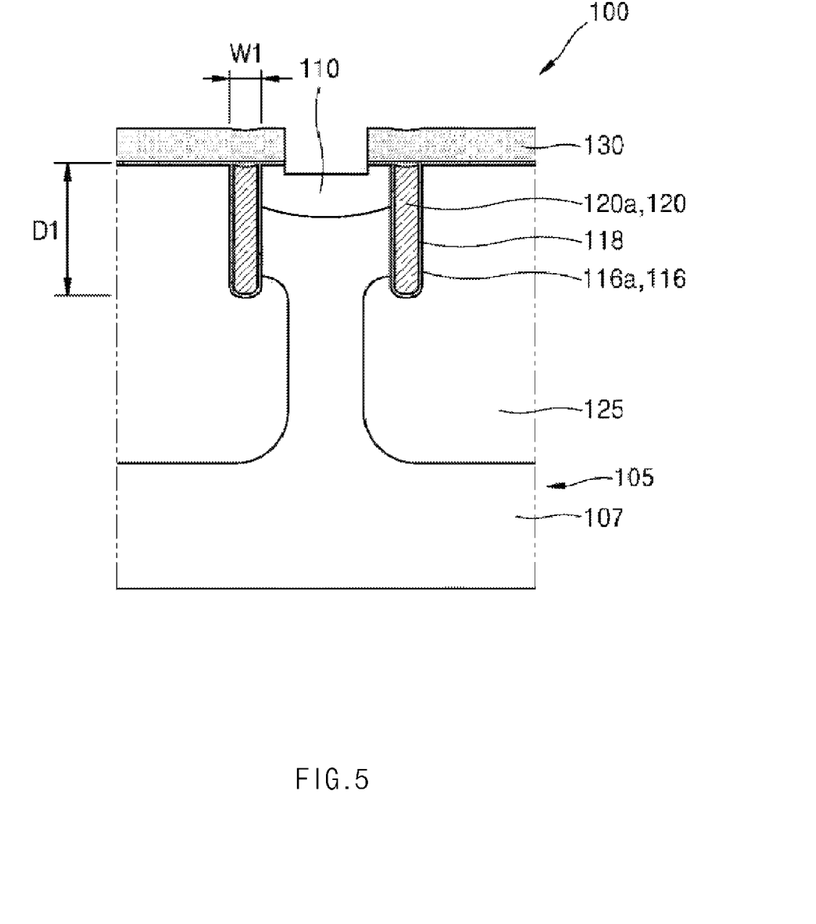
FIG. 5 is a cross-sectional view taken along line V-V of the power semiconductor device of FIG. 4.
Figure 6:
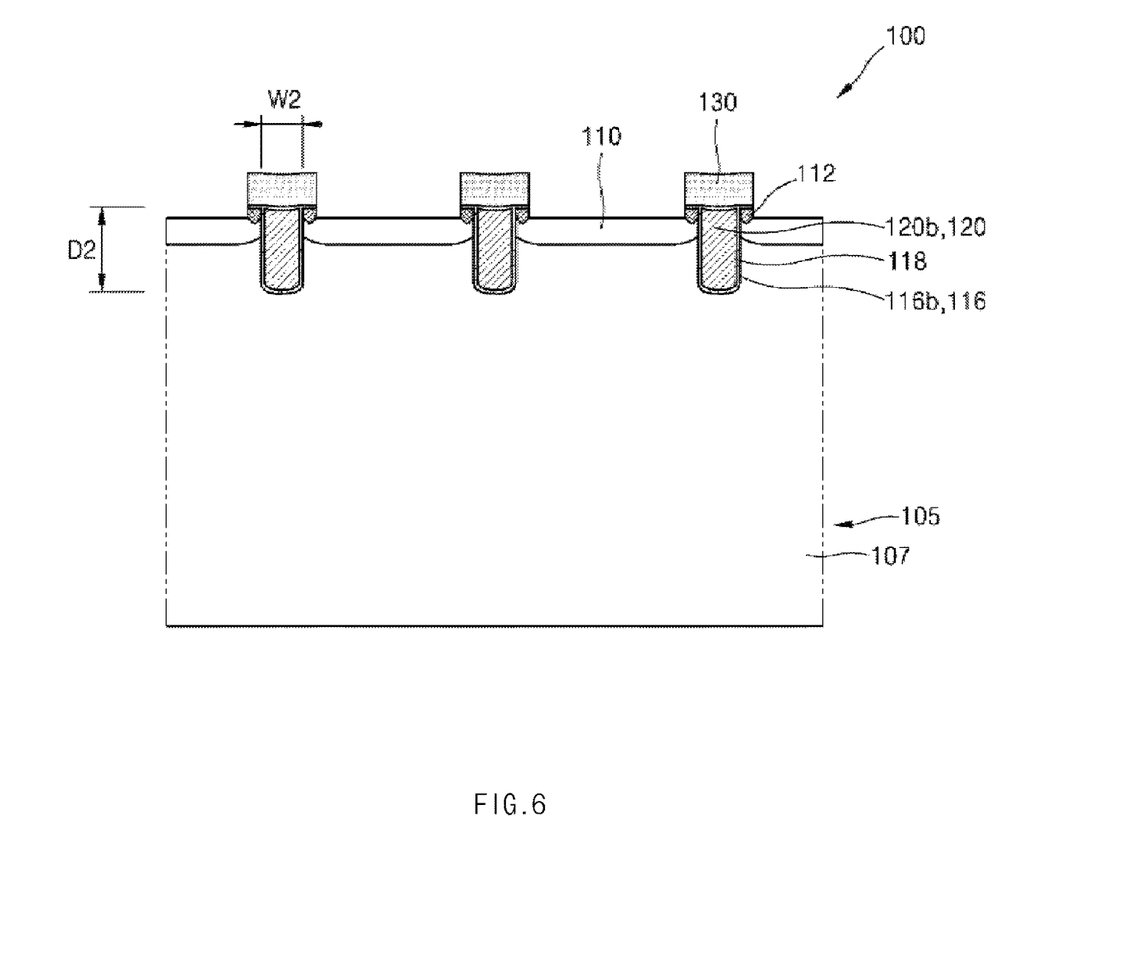
FIG. 6 is a cross-sectional view taken along line VI-VI of the power semiconductor device of FIG. 4.

For example, the power semiconductor transistor PT and/or the current sensor transistor ST may include a structure of a power semiconductor device 100 of FIGS. 4 to 6. In some embodiments, the power semiconductor transistor PT and the power semiconductor device 100 may be used interchangeably.

FIG. 4 is a plan view showing a power semiconductor device 100 according to an embodiment of the present disclosure, FIG. 5 is a cross-sectional view taken along line V-V of the power semiconductor device of FIG. 4, and FIG. 6 is a cross-sectional view taken along line VI-VI of the power semiconductor device of FIG. 4.

Referring to FIGS. 4 to 6, the semiconductor layer 105 may refer to one or a plurality of semiconductor material layers, for example, may refer to a part of a semiconductor substrate and/or one or multiple epitaxial layers.

At least one trench 116 may be recessed from a surface of the semiconductor layer 105 into the semiconductor layer 105 by a specific depth to be formed. The number of trenches 116 may be appropriately selected depending on performance of the power semiconductor device 100 and does not limit the scope of this embodiment.

The trench 116 may have a ladder shape including a pair of lines 116a and a plurality of connectors 116b connecting between the pair of lines 116a. The connectors 116b may be formed to be spaced apart at regular intervals between the lines 116a.

For example, in the trench 116, the lines 116a may have a first depth D1, and the connectors 116b may have a second depth D2. The second depth D2 may be smaller than the first depth D1, and thus, the depth of the connectors 116b may be shallower than the depth of the lines 116a. Further, a width W2 of each of the connectors 116b of the trench 116 may be greater than a width W1 of each of the lines 116a. This structure may relieve electric field stress nearby the connectors 116b.

Further, the trenches 116 may have a rounded edge, for example, a bottom edge thereof for suppressing concentration of the electric field.

For example, the semiconductor layer 105 may include a drift region 107 and a well region 110. Furthermore, the semiconductor layer 105 may further include an emitter region 112 in the well region 110. Here, the emitter region 112 may be referred to as a source region, and hereinafter, the emitter region 112 may mean the source region. Also, the semiconductor layer 105 may further include a floating region 125.

More specifically, the well region 110 may be defined in the semiconductor layer 105 between the lines 116a of the trench 116 and between the connectors 116b of the trench 116. That is, the well region 110 may be a region of the rectangular semiconductor layer 105 surrounded by the ladder-shaped trench 116.

The floating region 125 may be defined in the semiconductor layer 105 outside the lines 116a of the trench 116. For example, the floating region 125 may be formed in the semiconductor layer 105 outside the ladder-shaped trench 116.

The floating region 125 may further extend below the lines 116a to surround a bottom surface of the lines 116a of the trench 116 for relieving the electric field. However, the floating region 125 may not extend below the connectors 116b. Accordingly, as illustrated in FIG. 6, the floating region 125 may not exist under the well region 110 and the connectors 116b along the line VI-VI of FIG. 4.

In FIG. 4, the well regions 110 may be spaced with the connectors 116b in an extension direction of the lines 116a, that is, along the line VI-VI. The floating regions 125 and the well regions 110 may be alternately disposed with the lines 116a therebetween along the V-V line.

For example, the well region 110 and the floating region 125 may be doped with the same type dopants.

The emitter region 112 may be formed adjacent to the trenches 116 at a specific depth within the well region 110. For example, the emitter region 112 may not be formed in portions adjacent to the lines 116a in the well region 110, but may be formed in portions adjacent to the connectors 116b. Accordingly, the emitter region 112 may be formed in the well region 110 adjacent to the connectors 116b in the extension direction of the lines 116a, that is, along the line VI-VI.

For example, the emitter region 112 and the well region 110 may be doped in opposite type dopants.

The drift region 107 may be defined in the semiconductor layer 105 under the well region 110. For example, the drift region 107 may be defined between the trenches 116 in contact with the well region 110 and may extend below the floating region 125 and to a lower surface of the semiconductor layer 105.

For example, the drift region 107 and the emitter region 112 may have a first conductivity type, and the well region 110 and the floating region 125 may have a second conductivity type. The first conductivity type and the second conductivity type may have opposite conductivity types, but may be any one of n-type and p-type, respectively. For example, when the first conductivity type may be n-type, the second conductivity type may be p-type, and vice versa.

In some embodiments, the drift region 107 may be provided as an epitaxial layer of a first conductivity type, and the well region 110 may be doped with an impurity of a second conductivity type to the epitaxial layer or may be formed with an epitaxial layer of the second conductivity type. The emitter region 112 may be formed by doping an impurity of the first conductivity type in the well region 110 or by additionally forming an epitaxial layer of the first conductivity type.

Further, when the power semiconductor device 100 is an IGBT, a collector region (not shown) may be provided under the drift region 107, and a collector electrode (not shown) may be provided under the collector region to be connected to the collector region. For example, the collector region may be provided under the drift region 107 as an epitaxial layer having a second conductivity type different from that of the drift region 107.

As another example, when the power semiconductor device 100 is a power MOSFET, a drain electrode may be connected under the drift region 107.

A gate insulating layer 118 may be formed on an inner wall of at least one trench 116. For example, the gate insulating layer 118 may be formed to have a uniform thickness on the inner wall of the trench 116.

A gate electrode layer 120 may be formed on the gate insulating layer 118 to fill at least one trench 116. For example, the gate electrode layer 120 may be formed to be recessed into the semiconductor layer 105, and in this case, the gate electrode layer 120 may be understood as having a recess type or a trench type.

For example, the gate electrode layer 120 may include a first portion 120a formed by filling the lines 116a and a second portion 120b formed by filling the connectors 116b.

A shape of the gate electrode layer 120 in the trench 116 may correspond to a structure of the trench 116. Therefore, since a second depth D2 of the connectors 116b of the trench 116 is smaller than a first depth D1 of the lines 116a, a depth of the second portion 120b of the gate electrode layer 120 may be shallower than a depth of the first portion 120a. The depth of the second portion 120b of the gate electrode layer 120 may be greater than that of the well region 110. Furthermore, a width of the second portion 120b of the gate electrode layer 120 may be larger than a width of the first portion 120a.

An arrangement of the gate electrode layer 120 on the plane may follow an arrangement of the trench 116, and thus the gate electrode layer 120 may be arranged in the ladder type in FIG. 4. Like the trench 116, the number of gate electrode layers 120 may be appropriately selected depending on operating specifications of the power semiconductor device 100, and the scope of this embodiment is not limited.

Furthermore, an emitter electrode (not shown) may be formed on the emitter region 112. The emitter electrode may be commonly connected to the emitter region 112 and the well region 110. An insulating layer 130 may be interposed between the semiconductor layer 105 and the emitter electrode.

According to the above-described structure, the floating region 125 may extend below the lines 116a of the trench 116 to surround a bottom surface of the first portion 120a of the gate electrode layer 120. However, the bottom surface of the second portion 120b of the gate electrode layer 120 may be exposed from the floating region 125 without being surrounded by the floating region 125.

Further, the emitter regions 112 may be adjacent to the second portion 120b of the gate electrode layer 120 in the well region 110 and may be spaced from each other in an extension direction of the first portion 120a of the gate electrode layer 120.

A lower part of the trench 116 may be protected through the ladder-shaped stripe part, that is, through the structure of the lines 116a of the trench 116 and the first portion 120a of the gate electrode layer 120 and the structure of the floating region 125, and therefore the power semiconductor device 100 described above may maintain a high internal breakdown voltage during turn-off.

In addition, the emitter region 112 may be disposed in a portion adjacent to the connectors 116b of the trench 116 and the second portion 120b of the gate electrode layer 120 and may not be disposed in a portion adjacent to the lines 116a of the trench 116 and the first portion 120a of the gate electrode layer 120, and therefore a gate-collector capacitance Cgc value may be reduced by changing a moving path of a hole when the power semiconductor device 100 is operated. Accordingly, a negative gate charging (NGC) phenomenon may be reduced and switching stability may be improved.

In addition, the depth of the second portion 120b of the gate electrode layer 120 may be lowered, and the width of the second portion 120b of the gate electrode layer 120 may be increased, thereby reducing electric field under the second portion 120b of the gate electrode layer 120 and the gate-collector capacitance (Cgc) value.

Furthermore, when a distance between the first portions 120a of the gate electrode layer 120 becomes narrower, the effect of the charge sharing phenomenon increases, and thus, as equipotential surfaces under the adjacent first portions 120a are connected, the electric field stress below the gate electrode layer 120 may be further relieved.

The above description has been described for the case in which the power semiconductor device is the IGBT, but may be applied to a power MOSFET as it is.

In FIGS. 1 to 3, the power semiconductor chip 50 may use the power semiconductor device 100 of FIGS. 4 to 6 as the power semiconductor transistor PT and/or the current sensor transistor ST, and thus characteristics of the power semiconductor device 100 described above may be applied to the power semiconductor chip 50 as it is.

Therefore, the ladder-shaped trench 116 and the shape change of the gate electrode layer 120 may be provided, and thus the above-described power semiconductor device 100 and the power semiconductor chip 50 using the power semiconductor device 100 may maintain the breakdown voltage at high voltage, suppress the negative gate charging phenomenon, and increase switching stability.

According to the power semiconductor device and the power semiconductor chip according to an embodiment of the present disclosure made as described above, it is possible to increase the switching stability by suppressing the negative gate charging (NGC) phenomenon while maintaining the breakdown characteristics to the high voltage.

The effect is illustrative, and the scope of the present disclosure is not limited thereby.

Hereinabove, although the present disclosure has been described with reference to exemplary embodiments and the accompanying drawings, the present disclosure is not limited thereto, but may be various modified and altered by those skilled in the art to which the present disclosure pertains without departing from the spirit and scope of the present disclosure claimed in the following claims.

What is claimed is:

1. A power semiconductor device comprising:
a semiconductor layer;
a ladder-shaped trench recessed a specific depth from a surface of the semiconductor layer into the semiconductor layer and comprising a pair of lines having a first depth and a plurality of connectors connected between the pair of lines and having a second depth shallower than the first depth;
a well region defined in the semiconductor layer between the pair of lines and between the plurality of connectors of the trench;
a floating region defined in the semiconductor layer outside the pair of lines of the trench;
a gate insulating layer disposed on an inner wall of the trench; and
a gate electrode layer disposed on the gate insulating layer to fill the trench and comprising a first portion in which the pair of lines is filled and a second portion in which the plurality of connectors is filled, wherein a depth of the second portion of the gate electrode layer is shallower than a depth of the first portion of the gate electrode layer,
wherein the floating region extends below the at least one pair of lines to surround a bottom surface of the first portion of the gate electrode layer, and
wherein a bottom surface of the second portion of the gate electrode layer is exposed from the floating region.

2. The power semiconductor device of claim 1, wherein a width of each of the connectors is greater than a width of each of the pair of lines, and
wherein a width of the second portion of the gate electrode layer is greater than a width of the first portion of the gate electrode layer.

3. The power semiconductor device of claim 1, wherein the depth of the second portion of the gate electrode layer is deeper than a depth of the well region.

4. The power semiconductor device of claim 1, further comprising:
source regions or emitter regions which are adjacent to the second portion of the gate electrode layer in the well region and are spaced apart from each other in an extension direction of the first portion of the gate electrode layer.

5. The power semiconductor device of claim 4, further comprising:
a drift region defined in the semiconductor layer under the well region.

6. The power semiconductor device of claim 5, wherein the drift region and the source regions or the emitter regions are doped with an impurity of a first conductivity type, and
wherein the well region and the floating region are doped with an impurity of a second conductivity type opposite to the first conductivity type.

7. A power semiconductor chip comprising:
a semiconductor layer comprising a main cell area and a sensor area;
a power semiconductor transistor disposed in the main cell area and comprising the power semiconductor device according to claim 1;
a current sensor transistor disposed in the sensor area and configured to monitor a current of the power semiconductor transistor;
an emitter terminal connected to an emitter electrode of the power semiconductor transistor;
a current sensor terminal connected to an emitter electrode of the current sensor transistor; and
a gate terminal connected to a gate electrode of the power semiconductor transistor and a gate electrode of the current sensor transistor.

* * * * *